US012782803B2

(12) United States Patent
Tu et al.

(10) Patent No.: US 12,782,803 B2
(45) Date of Patent: Nov. 3, 2026

(54) METHOD AND APPARATUS FOR ETCHING A LITHOGRAPHY MASK

(71) Applicant: Carl Zeiss SMT GmbH, Oberkochen (DE)

(72) Inventors: Fan Tu, Dieburg (DE); Horst Schneider, Wiesbaden (DE); Markus Bauer, Schneckenlohe (DE); Petra Spies, Mainz (DE); Maximilian Rumler, Darmstadt (DE); Christian Felix Hermanns, Frankfurt am Main (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 606 days.

(21) Appl. No.: 18/105,948

(22) Filed: Feb. 6, 2023

(65) Prior Publication Data

US 2023/0185180 A1 Jun. 15, 2023

Related U.S. Application Data

(63) Continuation of application No. PCT/EP2021/072060, filed on Aug. 6, 2021.

(30) Foreign Application Priority Data

Aug. 7, 2020 (DE) ......................... 102020120884.7

(51) Int. Cl.
*G03F 1/24* (2012.01)
*G03F 1/76* (2012.01)
*G03F 1/78* (2012.01)

(52) U.S. Cl.
CPC .................. *G03F 1/24* (2013.01); *G03F 1/76* (2013.01); *G03F 1/78* (2013.01)

(58) Field of Classification Search
CPC ..... G03F 1/24; G03F 1/76; G03F 1/78; G03F 1/72; G03F 1/74; G03F 1/80; G03F 1/82;
(Continued)

(56) References Cited

U.S. PATENT DOCUMENTS 5,482,802 A * 1/1996 Celler ........................ G03F 1/74 430/311
5,807,650 A * 9/1998 Komano ................... G03F 1/26 430/5

(Continued)

FOREIGN PATENT DOCUMENTS

CN 1261458 A 7/2000
DE 103 38 019 3/2005 ......... H01L 21/3213

(Continued)

OTHER PUBLICATIONS

Office Action issued by the Korean Patent Office for Application No. KR 10-2023-7007392, dated Mar. 14, 2025 (with English Translation).

(Continued)

*Primary Examiner* — Binh X Tran
*Assistant Examiner* — Christopher Remavege
(74) *Attorney, Agent, or Firm* — Fish & Richardson P.C.

(57) ABSTRACT

Method for the particle beam-induced etching of a lithography mask, more particularly a non-transmissive EUV lithography mask, having the steps of:
a) providing the lithography mask in a process atmosphere,
b) beaming a focused particle beam onto a target position on the lithography mask,
c) supplying at least one first gaseous component to the target position in the process atmosphere, where the first gaseous component can be converted by activation into a reactive form, where the reactive form reacts with a material of the lithography mask to form a volatile compound, and (Continued)

d) supplying at least one second gaseous component to the target position in the process atmosphere, where the second gaseous component under predetermined process conditions with exposure to the particle beam forms a deposit comprising a compound of silicon with oxygen, nitrogen and/or carbon.

21 Claims, 10 Drawing Sheets

(58) Field of Classification Search
CPC ......... C23C 28/00; C23C 28/30; C23C 28/32; C23C 28/322; C23C 28/34; C23C 28/341; C23C 28/345; H01J 37/3178
See application file for complete search history.

(56) References Cited

U.S. PATENT DOCUMENTS

| | | | | |
|---|---|---|---|---|
| 6,440,615 | B1 * | 8/2002 | Shimizu | G03F 1/74 430/5 |
| 6,891,171 | B1 * | 5/2005 | Hagiwara | H01J 37/3056 430/5 |
| 9,257,273 | B2 * | 2/2016 | Koyama | H01J 37/3178 |
| 10,372,032 | B2 * | 8/2019 | Oster | C23C 14/048 |
| 10,572,990 | B2 | 2/2020 | Yoshitake et al. | |
| 2002/0024011 | A1 * | 2/2002 | Shimizu | G03F 1/20 430/296 |
| 2003/0047691 | A1 * | 3/2003 | Musil | G03F 1/74 430/5 |
| 2008/0314871 | A1 * | 12/2008 | Toth | B81C 1/00531 216/48 |
| 2008/0318138 | A1 | 12/2008 | Holfeld | |
| 2011/0279799 | A1 * | 11/2011 | Singer | G03F 7/70925 355/53 |
| 2012/0273458 | A1 | 11/2012 | Bret et al. | |
| 2012/0328974 | A1 | 12/2012 | Takaoka | |
| 2013/0224889 | A1 * | 8/2013 | Koyama | H01J 37/3178 118/723 R |
| 2014/0038088 | A1 | 2/2014 | Lee et al. | |
| 2014/0113220 | A1 * | 4/2014 | Chu | G03F 1/72 355/72 |
| 2014/0255831 | A1 | 9/2014 | Hofmann et al. | |
| 2017/0235217 | A1 | 8/2017 | Qi et al. | |
| 2017/0248842 | A1 * | 8/2017 | Oster | C23C 16/405 |
| 2020/0249564 | A1 * | 8/2020 | Budach | G03F 1/74 |

FOREIGN PATENT DOCUMENTS

| | | | |
|---|---|---|---|
| DE | 102013104390 | 2/2014 | G03F 1/22 |
| DE | 102013203995 | 9/2014 | H01L 21/027 |
| DE | 102017208114 | 5/2018 | G03F 1/74 |
| DE | 102019201468 | 8/2020 | G03F 1/74 |
| EP | 1 664 924 | 5/2012 | G03F 1/74 |
| JP | 2014-174552 | 9/2014 | G03F 1/74 |
| JP | 2015-125166 | 7/2015 | G03F 1/48 |
| KR | 10-2022-0006477 A | 1/2022 | |
| KR | 10-2022-0098097 A | 7/2022 | |
| TW | 201843524 | 12/2018 | G03F 1/84 |
| WO | WO 2005/017949 | 2/2005 | |

OTHER PUBLICATIONS

Office Action issued by the Japanese Patent Office for Application No. JP 2023-507771, dated Feb. 19, 2024 (with English Translation).
Office Action in Korean Appln. No. 10-2023-7007392, mailed on Oct. 30, 2025, 7 pages (with English translation).
International Search Report and Written Opinion for the International Searching Authority for International Application No. PCT/EP2021/072060, dated Nov. 30, 2021.
Office Action and Search Report issued by the Taiwan Patent Office for Application No. TW 110128979, dated Jul. 26, 2024 (with English Translation).
Office Action issued by the German Patent Office for Application No. DE 10 2020 120 884.7, dated Oct. 11, 2024 (with English Translation).
Notice of Allowance in Korean Appln. No. 10-2023-7007392, mailed on Aug. 27, 2026, 5 pages (with English translation).
Office Action and Search Report in Chinese Appln. No. 202180057024.9, mailed on Aug. 7, 2026, 17 pages (with English translation).

* cited by examiner

METHOD AND APPARATUS FOR ETCHING A LITHOGRAPHY MASK

CROSS-REFERENCE TO RELATED APPLICATIONS

This application is a continuation of and claims priority under 35 U.S.C. § 120 from PCT Application No. PCT/EP2021/072060, filed on Aug. 6, 2021, which claims priority from German Application No. DE 10 2020 120 884.7, filed on Aug. 7, 2020. The entire contents of each of these priority applications are incorporated herein by reference.

TECHNICAL FIELD

The present invention relates to a method and an apparatus for etching a lithography mask.

BACKGROUND

Microlithography is used for producing microstructured components, such as, for example, integrated circuits. The microlithography process is performed using a lithography apparatus, which has an illumination system and a projection system. The image of a mask (reticle) illuminated by use of the illumination system is in this case projected by use of the projection system onto a substrate, for example a silicon wafer, which is coated with a light-sensitive layer (photoresist) and arranged in the image plane of the projection system, in order to transfer the mask structure to the light-sensitive coating of the substrate.

In order to attain small structure sizes and hence to increase the integration density of the microstructured components, use is increasingly being made of light having very short wavelengths, referred to for example as deep ultraviolet (DUV) or extreme ultraviolet (EUV). DUV has a wavelength of 193 nm, for example, and EUV has a wavelength of 13.5 nm, for example. The lithography masks in these cases themselves have structure sizes situated in the 5-100 nm range. Producing lithography masks of these kinds is very complicated and hence expensive, particularly since the lithography masks have to be defect-free, there being otherwise no guarantee that a structure generated with the lithography mask will have the desired function. For this reason, lithography masks are subject to verification, for example, meaning that the absence of defects in the lithography mask is tested. In this procedure, defects are detected and localized, enabling targeted repair of the defects. Typical defects are the absence of intended structures, owing, for example, to the unsuccessful implementation of an etching procedure, or else there are unintended structures present, owing for example to an excessively quick etching procedure or to an etching procedure which has taken effect in the wrong place. These defects can be eliminated by targeted etching of excess material or targeted deposition of additional material at the positions in question, such operations being possible in a highly targeted way by use, for example, of focused electron beam-induced processes (FEBIP).

DE 10 2017 208 114 A1 discloses a method for the particle beam-induced etching of a photolithographic mask, having the steps of: providing an activating particle beam at a location to be etched; and providing an etching gas at the location to be etched, where the etching gas comprises a first gaseous component and water vapor as a second gaseous component, and where the first gaseous component comprises nitrogen, oxygen and chlorine in one compound.

DE 10 2013 203 995 A1 discloses a method and an apparatus for protecting a substrate while it is worked on with at least one particle beam. The method includes the following steps: mounting a locally confined protective layer on the substrate; etching the substrate and/or a layer disposed on the substrate by the particle beam and at least one gas, and/or depositing material on the substrate by the particle beam and at least one precursor gas; and removing the locally confined protective layer from the substrate.

SUMMARY

Against this background it is an object of the present invention to improve the working of a lithography mask.

According to a first aspect, a method is proposed for the particle beam-induced etching of a lithography mask, more particularly a non-transmissive EUV lithography mask. In a first step a) the lithography mask is provided in a process atmosphere. In a second step b) a focused particle beam is beamed onto a target position on the lithography mask. In a third step c) at least one first gaseous component is supplied to the target position in the process atmosphere, where the first gaseous component can be converted by activation into a reactive form, where the reactive form reacts with a material of the lithography mask to form a volatile compound. In a fourth step d) at least one second gaseous component is supplied to the target position in the process atmosphere, where the second gaseous component comprises a compound of silicon with oxygen, nitrogen and/or carbon.

This method has the advantage that the etching process taking place can be controlled more effectively and therefore carried out in a more targeted and specific way. By this means it is possible overall to increase the process resolution of the etching process. Accordingly, lithography masks with smaller structures can be worked on in a targeted way, and/or defects with a smaller size can be worked on.

The specified sequence of the individual method steps, especially of steps b)-d), need not necessarily take place in the specified order; instead, the steps may be carried out synchronously, alternately and/or in a different combination or temporal sequence.

Steps c) and d) are carried out, in particular, temporally before and/or synchronously to step b).

The etching process starts when a suitable composition of the process atmosphere for etching the lithography mask is present and the particle beam is beamed with a suitable energy onto the target position. Supplying the two gaseous components before the particle beam is actually beamed makes it possible to ensure, for example, that extraneous gases—still present in the process atmosphere from a preceding process step, for example—are purged out and therefore that the process atmosphere has the desired composition from the start of the etching process. The continued supplying of the gaseous components while the particle beam is being beamed makes it possible to ensure that the composition of the process atmosphere remains constant and/or stays within a defined range.

Steps c) and d) may be carried out synchronously or at different times—for example, the first and second gaseous components are supplied intermittently or alternately. The first and second gaseous components are supplied more particularly in such a way that the composition of the process atmosphere at the target position is within a predetermined range. In embodiments it is possible for the first and second gaseous components to be mixed before being supplied to the target position, and for the mixture with the desired composition to be supplied to the target position.

The particle beam-induced etching advantageously takes place substantially at the position at which the particle beam impinges on the surface of the lithography mask that is to be worked. The spatial confinement or resolution of the etching process is dependent, for example, on the nature of the particle beam. The particle beam may comprise, for example, photons, ions, protons, neutrons or else electrons. The use of an electron beam is particularly advantageous, since it can be focused on a very small impingement area while at the same time the electrons cause no substantial damage to the surface subjected to the beam. The achievable resolution with an electron beam is therefore particularly high.

In principle the etching process at the molecular level is such that the particle beam impinges on the surface to be worked, where it triggers, for example, secondary electrons which emerge from the surface in the region of the impingement area, for example. The energy of these secondary electrons may be sufficient to bring about dissociation of molecules. Where a secondary electron of this kind impinges on a hitherto unactivated etching gas molecule adsorbed, for example, on the surface, that molecule may undergo dissociation and therefore be brought into a reactive form. The reactive form reacts with an atom or molecule in the surface of the material, for example, to form a volatile compound. In this way, therefore, the surface is eroded. The precise physico-chemical processes which take place here are very diverse and complex and are a topic of current research.

Critical parameters which substantially influence the etching process and are therefore used to control said process are, for example, the temperature, the composition of the process atmosphere, a local gas pressure at the target position, the partial pressures of the components, and an intensity and energy of the particle beam. This enumeration is not exhaustive.

The process atmosphere is, for example, an atmosphere having a controlled composition and a controlled pressure which is situated, for example, in the range from 10' to $10^{-8}$ mBar. The process atmosphere is provided, for example, by an evacuated housing. The process atmosphere is nevertheless subject to spatial and temporal fluctuations. In particular, the process atmosphere in the working region may have a substantial variation in its composition, as this composition depends on the supply of the process gases and also the chemical reactions. Additionally, the pressure of the process atmosphere when the lithography mask is being worked on may be higher by comparison with times in which no work is taking place, by several orders of magnitude. The pressure may also be different by several magnitudes in the working region by comparison with the pressure elsewhere in the evacuated housing.

The lithography mask is more particularly an EUV lithography mask. EUV stands for "extreme ultraviolet" and denotes a working light wavelength in a range of 0.1-30 nm, more particularly 13.5 nm. At these wavelengths it is necessary to use reflective optical elements, and this applies to the lithography mask as well. The lithography mask therefore has a layer which is reflective for the EUV radiation and which is embodied more particularly as a Bragg mirror, and also has a structured absorbing layer on the reflecting surface. Such masks are also referred to as binary lithography masks. The effect of the structured absorbing layer is to achieve spatial modulation of the intensity of the reflected radiation, leading ultimately to a controlled local variation in exposure on the sample.

The lithography mask therefore has regions, for example, which reflect as far as possible the entirety of the incident radiation, as well as other regions which absorb a certain part of the radiation. The radiation need not be absorbed fully in these regions. The level of residual intensity that is still tolerable depends on the particular lithography process. Preferably less than 10% of the incident intensity is reflected.

Any defect or fault in the structure of the structured layer will lead to an unwanted exposure in the lithography process, and it is therefore particularly important for the lithography mask to have as few defects as possible. Defects present are ascertained using defined testing methods and are subsequently subjected where possible to targeted repair. The method proposed here is especially suitable for removing material which has remained at positions at which there ought to be no material. This is also called an opaque defect, since the material absorbs the EUV radiation and the intensity in the reflected radiation is therefore too low. These defects can be eliminated by targeted etching of the excess material.

In a third step c), at least one first gaseous component is supplied to the target position in the process atmosphere. In the present case, the first gaseous component forms the etching gas. A feature of this gas is that it comprises highly reactive constituents in a compound having comparatively low reactivity. Reactive constituents include, in particular, halogens, such as fluorine or chlorine. The etching gas can be decomposed by activation or otherwise converted into the reactive form.

The etching gas is supplied as close as possible to the target position in the process atmosphere. The etching gas itself has a pressure, for example, in the range from $10^{-3}$ to $10^{-4}$ mBar. Individual molecules of the etching gas will adsorb on the surface of the lithography mask. In the adsorbed state, these molecules are bound to the surface at a low distance, but may also diffuse on the surface. In this way, for example, an adsorbed monolayer of the molecules may form on the surface of the lithography mask, preferably in the region of the target position. As a result of the physical closeness of the adsorbed molecules to the surface atoms of the lithography mask, there is a great increase in the probability of a dissociated reactive molecule reacting with an atom of the surface.

The etching gas is activated indirectly via the particle beam. As already described, the activation is triggered, for example, by secondary electrons elicited from the surface by the particle beam. Activation may also take place directly by the particles of the particle beam; however, an effective cross section for such a reaction is very small, and its contribution is therefore only small. The effective cross section is dependent, for example, on the beam energy, which can be used to influence it.

Advantageously, the reaction of the active species in the etching gas with a surface atom forms a volatile compound which can be pumped off from the target position via the process atmosphere.

Although the particle beam-induced etching process as described above already results in a high process resolution, there may also be unwanted side effects, such as spontaneous reactions not induced by the particle beam, or etching reactions at positions other than the target position. In order to have better control over the etching process it is therefore proposed that a second gaseous component be supplied to the target position in the process atmosphere. The second gaseous component comprises a compound of silicon with oxygen, nitrogen and/or carbon. The second gaseous component may more particularly comprise a compound which under predetermined process conditions, on exposure to the particle beam, is able to form a deposit comprising a compound of silicon with oxygen, nitrogen and/or carbon. These predetermined process conditions include, in particular, a pressure and also a partial pressure of the second gaseous component at the target position, and also a further composition of the process atmosphere at the target position. It is also possible to say that the second gaseous component comprises a deposition gas.

This is unusual, since the aim of the working is to ablate material and not to build up material. In experiments, however, the applicant has shown that by supplying such a deposition gas, the etching process can be carried out with improved control, in relation in particular to an etching rate, and also with significantly reduced damage to the lithography mask not only at the target position but also at other positions.

Correspondingly to the first gaseous component, the second gaseous component is supplied as far as possible in a targeted way at the target position. The molecules of the second gaseous component may likewise adsorb on the surface of the lithography mask. In this case the two gaseous components compete for the free sites on the surface. At equilibrium, for example, a distribution will come about, dependent on factors including the partial pressures of the two components in the gas phase, the propensity for adsorption on the respective surface, and individual mobilities on the part of the molecules.

If a molecule of the second gaseous component, adsorbed on the surface, is activated, as may take place, for example, by a secondary electron, then the molecule may decompose, in which case, for example, a molecule with silicon and oxygen, such as SiO or $SiO_2$, attaches on the surface. During the proposed etching method, the process conditions are preferably set such that no deposit is formed or a deposit is formed only to an insubstantial extent. This means, for example, that a ratio of etched material to deposited material is at least 5:1, preferably 10:1, more preferably 20:1, more preferably still 50:1, and even more preferably 100:1.

It is also possible to say that an etching process takes place that is slowed down by the deposition process, proceeding in parallel at a significantly lower rate, and that the etching process can be controlled more effectively as a result. In light of the advantageously passivating effect of the second gaseous component or its reactive form (following activation by the particle beam or secondary effects as described above), however, this is not the only effect; instead, the etching process can also be more effectively spatially confined, and instances of damage at positions of the lithography mask not subject to the particle beam can be avoided.

In order to gain targeted control over the etching process, the individual gas flows of the first and second gaseous components are preferably controlled. The gas flow of the first gaseous component is situated, for example, in a range of 0.1 sccm-10 sccm (sccm=standard cubic centimeter). The gas flow of the second gaseous component is preferably set based on the gas flow of the first component: for example, a ratio of 100:1 through to 10 000:1 of the first gaseous component to the second gaseous component is set. The ratio of the gas flows of the first and second components is particularly relevant, since it determines the stoichiometric ratio of the components in the region of the target position.

In embodiments, the process conditions of the etching process are set more particularly such as to avoid layer formation or deposition of material. Such layer formation may result, for example, from the presence of the second gaseous component in the process atmosphere. "Layer formation" in this context means more particularly that more than merely an insubstantial number of atoms, such as individual atoms, for example, over an area of 1 $nm^2$, settle on the surface or react therewith. Layer formation is avoided, for example, when no coherent layer is formed. The process conditions comprise, in particular, a pressure of the process atmosphere, a respective partial pressure of the first and second gaseous components at the target position, a further composition of the process atmosphere at the target position, a temperature, and an energy and intensity of the particle beam.

In one embodiment the second gaseous component comprises a silicate, a silane, a siloxane, a silazane and/or a silicon isocyanate.

Silicates are the salts and esters of ortho-silicic acid $Si(OH_4)$. Silanes have a silicon skeleton saturated with hydrogen. Siloxanes and silazanes are compounds derived from the silanes, with siloxanes having the general empirical formula $R_3S[O—SiR_2]_n—O—SiR_3$ (where R is a radical which may be a hydrogen atom or an alkyl radical) and silazanes having the general empirical formula $R_3Si—[NH—SiR_2]n—NH—SiR_3$.

An example of a silicate is tetraethyl orthosilicate $Si(OC_2H_5)_4$; an example of a silane is cyclopentasilane $H_{10}Si_5$; an example of a siloxane is pentamethyldisiloxane $C_5H_{15}OSi_2$; an example of a silazane is 1,1,3,3-tetramethyldisilazane $(CH_3)_2(SiH)_2O$; and an example of a silicon isocyanate is tetraisocyanatosilane $C_4N_4O_4Si$. The particular composition of any deposit formed is dependent on factors including, in particular, the further additive gases which are supplied in the working process. For example, in the case of a silane in conjunction with ammonia $NH_3$, a deposit containing silicon nitride might be formed.

According to another embodiment, the second gaseous component, under predetermined process conditions with exposure to the particle beam, forms a deposit comprising a compound of silicon with oxygen, nitrogen and/or carbon.

It may be noted that the formation of such a deposit in the context of the proposed etching process is preferably avoided by appropriate setting of the process conditions.

As already mentioned above, the precise chemical composition of any deposit formed is also dependent on the further additive gases which are supplied in the working process. For example, in the case of a silane in conjunction with ammonia $NH_3$, a deposit containing silicon nitride might be formed.

According to another embodiment, a deposit formed during the etching process by the second gaseous component is removed in a step of wet-chemical cleaning of the lithography mask.

This has the advantage that the deposit, which during the particle beam-induced etching process has a protective effect, is removed without residue and therefore exerts no influence in a lithography process carried out with the lithography mask which has been worked on.

According to another embodiment, the first gaseous component comprises one of xenon difluoride $XeF_2$, sulfur hexafluoride $SF_6$, sulfur tetrafluoride $SF_4$, nitrogen trifluoride $NF_3$, phosphorus trifluoride $PF_3$, tungsten hexafluoride $WF_6$, tungsten hexachloride $WCl_6$, molybdenum hexafluoride $MoF_6$, hydrogen fluoride HF, nitrogen oxygen fluoride NOF and/or triphosphorus trinitrogen hexafluoride $P_3N_3F_6$.

According to another embodiment, the second gaseous component is supplied temporally before and/or after the beaming of the particle beam onto the target position.

The second gaseous component is passed to the target position via a line system, for example. In this case, valves or similar control devices may be provided for the purpose of setting a volume or mass flow rate of the second gaseous component in the line system, in order to have precise control over the supply of the second gaseous component. For example, before the target position is subjected to beaming, the second gaseous component is supplied, by the opening of a corresponding valve. The valve is then closed and the particle beam is beamed in. Depending on the length of the line from the valve to a nozzle at the target position, there is still a decreasing gas flow into the process atmosphere even with the valve closed. Moreover, gas molecules adsorbed on the surface still remain adsorbed on the surface for a time, and so the positive effect is achieved despite the fact that the second gaseous component is no longer being supplied during beaming. It can also be said that a partial pressure or a stoichiometric fraction of the second gaseous component in the process atmosphere in the region of the target position, even after the closing of the valve, is still high enough for a certain period in order to achieve the positive effect.

According to another embodiment, the second gaseous component is supplied during the beaming of the particle beam onto the target position.

According to another embodiment, a third gaseous component, which comprises an oxidizing agent and/or a reducing agent, is additionally supplied.

The third gaseous component may take place temporally before, during and/or after the beaming of the particle beam onto the target position. The third gaseous component may be supplied temporally before, during and/or after the supplying of the first and/or second gaseous component and/or intermittently relative to the first and/or second gaseous component. Intermittently in this context means that the respective components are supplied alternately.

Examples of oxidizing agents are hydrogen peroxide $H_2O_2$, dinitrogen oxide $N_2O$. Examples of reducing agents are nitrogen oxide NO, nitrogen dioxide $NO_2$, nitric acid $HNO_3$, hydrogen $H_2$, ammonia $NH_3$, and/or methane $CH_4$. It may be pointed out that oxidizing agents may also act as reducing agents, and reducing agents may also act as oxidizing agents, according to the strength of the oxidizing or reducing capacity of the other respective component which is being oxidized or reduced.

By use of a third gaseous component it is possible to exert even more effective control over the etching process, by creating additional reaction pathways and/or favorably influencing a chemical equilibrium of an equilibrium reaction.

In embodiments, it is possible additionally to supply a chemically inert buffer gas, which may contribute in particular to a stabilization of the etching process, such as an etching rate which is substantially uniform spatially and temporally. Suitable buffer gases are preferably noble gases, such as argon, for example.

According to a further embodiment, the supplying of the first gaseous component, the second gaseous component and/or the third gaseous component comprises providing a solid or liquid phase of the respective component, setting a temperature of the solid or liquid phase of the respective component such that a mandated vapor pressure of the respective component is achieved over the solid or liquid phase, and supplying the respective gaseous component to the process atmosphere via a respective supply line.

This embodiment is particularly advantageous in respect of the control of the individual gas flows of the respective component. For example, for each component supplied, a separate container or tank is provided, in which the respective solid or liquid phase is stored. Each tank has a dedicated thermal conditioning means which can be used to set the temperature of the tank contents. The thermal conditioning means comprises, for example, electrothermal elements, such as a Peltier element, which can be used for cooling or for heating. It is also possible for cooling circuits to be provided, in order to achieve a temperature of well below 0° C.

The vapor pressure of the solid or liquid phase of a respective component can be controlled very precisely via the temperature. Because of the low pressure of the process atmosphere, there is a pressure gradient from a respective tank into the process atmosphere, and this causes the respective gaseous component to flow from the tank via the supply line into the process atmosphere.

The separate gas flows of the two or more gaseous components are mixed with one another, for example, in a common mixing chamber, which is the end point of the respective supply lines and from which a further supply line leads into the process atmosphere, and so a homogeneous mixture is formed.

According to another embodiment, a mass flow rate and/or volume flow rate of the respective gaseous component is controlled by setting a line cross section of the respective supply line and/or by controlling a duty cycle of a closing valve.

In this way it is possible to control the gas flow quantity with greater precision, and to achieve rapid variations in a gas flow. For example, before the particle beam is beamed in, a first gas flow ratio of the first and second gaseous components is selected, while a second gas flow ratio is selected during beaming, and a third gas flow ratio is selected after beaming. The respective durations here are in the region of minutes. The temperature of the solid or liquid phase of the respective component cannot be changed rapidly, since the processes of thermal conduction themselves operate on a timescale in the region of several minutes.

For example, in the respective supply line there is a respective supply valve for controlling the mass flow rate and/or the volume flow rate of the respective gaseous component, with the respective supply valve being configured to set a mandated line cross section.

Alternatively or additionally, the valve may be switched between a closed position and an open position in accordance with a mandated duty cycle or duty factor between 0 and 100. The duty cycle here indicates the ratio of a closing time of the supply valve to an opening time of the supply valve, where 0=always open and 100=always closed. Selecting one second, for example, as a base interval, meaning that the shortest possible opening or closing time is one second, a duty cycle of 10 means that the supply valve is open for one second and then closed for ten seconds. This method, also referred to as "chopping", results in only a negligible fluctuation in the partial pressure of the respective gaseous component in the process atmosphere, in particular because the volume of the supply line maintains a gas flow, in the manner of a buffer, even when the valve is closed.

According to another embodiment the particle beam consists of charged particles, more particularly of electrons.

One advantage of electrons is that they cause only very little damage, or none, to the surface under the beam, since they do not penetrate the material deeply and can simply flow off as current. Moreover, electron beams can be focused onto very small areas of incidence, having a diameter in the region of 10 nm, and consequently the resolution of the etching process is particularly high.

According to another embodiment, the lithography mask is embodied for use in EUV lithography.

EUV lithography masks have a fundamentally different construction from lithography masks which can be utilized transmissively, such as, for example, lithography masks for DUV lithography (DUV: deep ultra-violet, working light wavelength 193 nm, for example). DUV lithography masks, for example, feature a transparent quartz substrate and a structured layer which is likewise transparent but has phase-influencing qualities, such as silicon nitride, for example. The chemistry of an EUV lithography mask is fundamentally different from this, because the optical properties of materials are fundamentally different at EUV wavelengths.

For example, the EUV lithography mask features a layered construction, where the base is formed by a carrier or substrate which may consist, for example, of fused silica or of silicon. Disposed on the side which later in operation receives the beam of the working light is a Bragg mirror or multilayer mirror, which is embodied specifically for the respective wavelength of the working light. In this arrangement, layers having a high and a low refractive index, based on the wavelength of the working light, and having a layer thickness of approximately half the wavelength of the working light, are disposed over one another in alternation. The working light has a wavelength, for example, of 13.5 nm. In that case, a suitable mirror would be a multilayer mirror comprising a plurality of double laminae, composed of molybdenum and silicon, for example, each having a layer thickness of 6.75 nm, in the form of a Bragg mirror (for normal incidence). The multilayer mirror may be produced using known deposition processes, such as chemical vapor deposition (CVD) or the like. Disposed on the multilayer mirror is an etch stop layer. Firstly, the etch stop layer has the function of halting etching processes utilized when structuring the structured lamina, so that the multilayer mirror is not attacked. Secondly, the etch stop layer is itself part of the multilayer mirror. The etch stop layer therefore has, in particular, a layer thickness adapted correspondingly to the working light. The etch stop layer consists, for example, of ruthenium or of another noble metal. The structured layer on the etch stop layer absorbs the EUV radiation and is therefore the layer which brings about modulation in the spatial illumination intensity of the radiation.

For EUV lithography masks, the surface homogeneity requirements are particularly exacting. It is necessary in particular to control any roughness of the reflecting surfaces in the sub-nanometer range, since otherwise there are scattering losses and the lithography process is impaired accordingly.

According to another embodiment, the lithography mask has an etch stop layer whose facing side carries a structured lamina composed of a material which is absorbing for the radiation used in a lithography process, where an etching rate of the activated first gaseous component in relation to the etch stop layer is lower at least by a factor of 2, preferably by a factor of 5, more preferably a factor of 10, than the etching rate in relation to the structured lamina.

The structured lamina comprises, in particular, compounds of tantalum, such as, for example, tantalum nitride TaN, tantalum oxide TaO, tantalum oxynitride TaNO, tantalum boron nitride TaBN and so on. Other materials which absorb the radiation used for exposure in the lithography process are likewise possible here, however. The etch stop layer comprises, in particular, a noble metal, such as ruthenium, for example. The etching process can be controlled more effectively through the etching selectivity.

According to another embodiment, the lithography mask comprises a mirror layer embodied as a multilayer mirror composed of a plurality of double layers, where a respective double layer comprises a first layer composed of a first chemical composition and a second layer composed of a second chemical composition, where a respective layer thickness of the first and second layers is in a range of 3-50 nm, preferably 3-20 nm, more preferably 5-10 nm, very preferably 5-8 nm, more preferably still 6-7 nm.

The optical properties of the first chemical composition and the second chemical composition, especially a refractive index, are different in relation to the radiation used in a lithography process.

The multilayer mirror comprises, for example, a number of 50-100 double layers, i.e. 100-200 individual layers. The multilayer mirror may additionally have further intermediate layers, which have the effect, for example, of reducing diffusion of atoms from one layer into the adjacent layer within the multilayer stack. Such interlayers preferably have a layer thickness which is substantially unnoticeable in optical terms—a thickness of a few layers of atoms, for example.

The respective combination of the first and second chemical compositions is selected preferably on the basis of a refractive index contrast on the part of the two chemical compositions. The respective layer thickness is preferably selected such that the optically active thickness of the layer corresponds to about half a wavelength, taking the angle of incidence into account. There may be a slight deviation from this, in order to compensate for intermediate layers, for example.

According to another embodiment, the particle beam has an energy of 1 eV-100 keV, preferably of 3 eV-30 keV, more preferably of 10 eV-10 keV, very preferably of 30 eV-3 keV, more preferably still of 100 eV-1 keV.

The beam energy is preferably selected such that as many as possible of the incident particles in the beam lead to activation of a molecule of the first gaseous component. A very reduced beam energy is advantageous for this purpose. On the other hand, charging effects of the lithography mask, which may occur as a result of the charge carriers supplied via the particle beam, may lead to diversion of the particle beam and hence to a reduction in the resolution. In order to minimize this effect, a higher beam energy is advantageous.

For example, the particle beam consists of electrons, with the electron beam having a current of 1-1000 pA, preferably in a range of 1-100 pA, more preferably in a range of 10-70 pA, very preferably in a range of 20-40 pA. A higher current may lead to a higher reaction rate and hence to acceleration of the etching process, but a higher current also leads to greater charging of the surface.

According to a second aspect, a lithography mask, more particularly a non-transmissive EUV lithography mask, is proposed, produced by a method according to the first aspect.

According to a third aspect, an apparatus for particle beam-induced etching of a lithography mask, more particularly of a non-transmissive EUV lithography mask, is proposed. The apparatus comprises a housing for the provision of a process atmosphere, and a means for the focused beaming of a particle beam at a target position on the lithography mask. Further provided is a means for the provision of a first gaseous component at the target position in the process atmosphere, where the first gaseous component can be converted by activation into a reactive form, where the reactive form reacts with a material of the lithography mask to form a volatile compound. Further provided is a means for the provision of a second gaseous component at the target position in the process atmosphere, where the second gaseous component comprises a compound of silicon with oxygen, nitrogen and/or carbon.

The apparatus comprises in particular a control device which for actuating the means for the focused beaming of a particle beam at the target position, for actuating the means for the provision of the first gaseous component at the target position and for actuating the means for the provision of the second gaseous component at the target position is configured in such a way that the first gaseous component and the second gaseous component are provided temporally before and/or synchronously to the focused beaming of the particle beam at the target position.

This apparatus is preferably operated in accordance with the method of the first aspect. The apparatus has the same advantages as the method described above.

The embodiments and features described for the proposed method are valid correspondingly for the proposed apparatus, and vice versa.

For example, the apparatus comprises an electron column, disposed in a vacuum housing, which is configured for the focused beaming of an electron beam onto a sample disposed on a sample holder. This apparatus may be, for example, a modified electron microscope. The vacuum housing advantageously provides the process atmosphere, with the pressure provided being, for example, a pressure in the range of $10^{-5}$-$10^{-8}$ mBar. The pressure in the process atmosphere may be subject to spatial and temporal fluctuations. The respective means for the provision of the first and second gaseous components comprises, in particular, a container or tank in which a large amount of the respective component is held. If the respective component is stored in gas form, the means is preferably a high-pressure container, which holds the gas under a pressure of several hundred bar. Provided advantageously in the container is a liquid or solid phase of the respective component, with the vapor pressure of the component being controlled via the temperature. In this case, individual gas molecules evaporate or sublime from the liquid or solid phase directly into the gas phase. The respective means further comprises a supply line, which ends in a nozzle as close as possible to the target position. In this way, the respective gaseous component is supplied very closely and in a targeted way to the target position on the lithography mask. This supply line may comprise valves and/or other process-engineering devices.

The control device is configured in particular to control the temporal course of a process carried out with the apparatus, such as the etching process. For example, the control device controls the electron microscope and controls valves in the supply lines for the first and second gaseous components. The control device may be implemented technically as hardware and/or software. If implemented as hardware, the control device may be embodied, for example, as a computer or as a microprocessor. If implemented as software, the control device may be embodied as a computer program product, as a function, as a routine, as an algorithm, as part of a program code, or as an executable object.

"A(n); one" in the present case should not necessarily be understood as restrictive to exactly one element. Rather, a plurality of elements, such as, for example, two, three or more, can also be provided. Any other numeral used here, too, should not be understood to the effect that there is a restriction to exactly the stated number of elements. Rather, numerical deviations upwards and downwards are possible, unless indicated to the contrary.

Further possible implementations of the invention also comprise not explicitly mentioned combinations of features or embodiments that are described above or below with respect to the exemplary embodiments. In this case, a person skilled in the art will also add individual aspects as improvements or supplementations to the respective basic form of the invention.

Further advantageous configurations and aspects of the invention are the subject matter of the dependent claims and also of the exemplary embodiments of the invention described below. In the text that follows, the invention is explained in more detail on the basis of preferred embodiments with reference to the accompanying figures.

DETAILED DESCRIPTION

Identical elements or elements having an identical function have been provided with the same reference signs in the figures, unless indicated to the contrary. It should also be noted that the illustrations in the figures are not necessarily true to scale.

Figure 1:
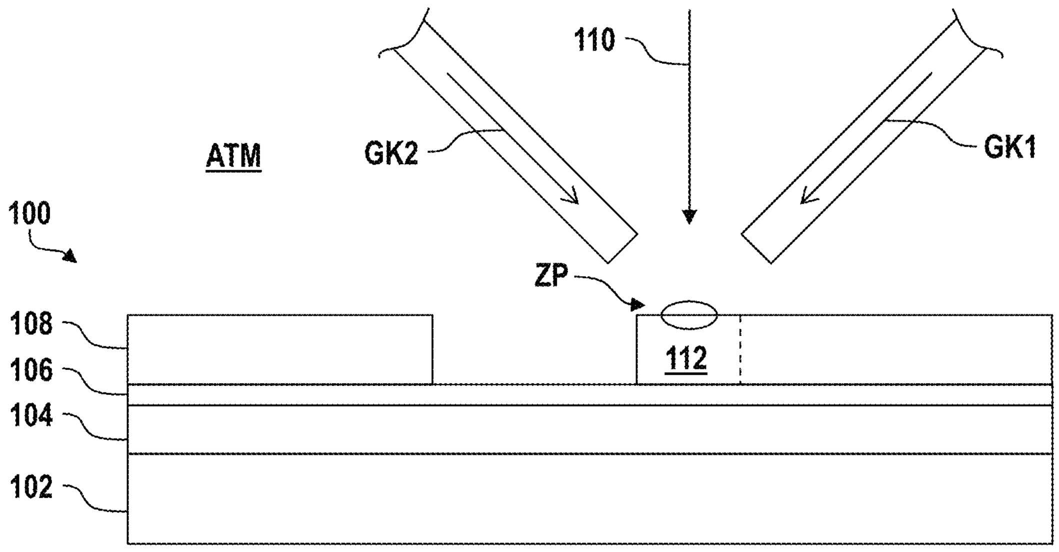
FIG. 1 shows schematically a section through a lithography mask which is undergoing a particle beam-induced processing operation.

FIG. 1 shows schematically a section through a lithography mask 100, which is undergoing a particle beam-induced processing operation. This operation is more particularly a locally induced etching process, in which material is ablated from the lithography mask 100. The etching process may also be applied (not shown) to foreign bodies, such as particles of dust, for example, which have settled on the surface of the lithography mask 100.

In the depicted example of the lithography mask 100, the mask is, for example, a mask suitable for EUV lithography, operated on a reflective basis. This means that the working light in operation impinges on the lithography mask 100 and is reflected back into the same half-space. EUV here stands for "extreme ultraviolet" and denotes a working light wavelength of between 0.1 nm and 30 nm.

In this example, the lithography mask 100 has a layered construction, in which the base is formed by a carrier or substrate 102, which may consist of fused silica, for example. Disposed on the side which is later irradiated in operation with the working light is a multilayer mirror 104, which as a Bragg mirror is embodied specifically for the respective wavelength of the working light. In this arrangement, layers of high and low refractive index, based on the wavelength of the working light, and having a layer thickness of approximately half the wavelength of the working light, multiplied by the sinus value of the incident angle of the working light on the lithography mask 100, are disposed over one another in alternation. The working light has a wavelength of 13.5 nm, for example. In that case a suitable multilayer mirror for an incident angle of 90° would be a mirror 104 comprising a plurality of double laminae of molybdenum and silicon each with a layer thickness of 6.75 nm, as a Bragg mirror. In the case of slanted incidence of light, the layer thickness selected must be smaller. The multilayer mirror 104 comprises, for example, up to 100 such double laminae. The multilayer mirror 104 may be produced by use of known deposition processes, such as chemical vapor deposition (CVD) or the like. Disposed on the multilayer mirror 104 is an etch stop layer 106. A first function of this etch stop layer 106 is to halt etching processes utilized in the structuring of the structured lamina 108, so that the multilayer mirror 104 or the substrate 102 are not attacked. Moreover, the etch stop layer 106 itself is part of the multilayer mirror 104, and therefore forms the first layer of the multilayer mirror 104. The etch stop layer 106 therefore has, in particular, a layer thickness adapted correspondingly to the working light. The etch stop layer 106 consists, for example, of ruthenium or of another noble metal.

A layer structure of this kind achieves, for example, a reflectivity of about 70% of the irradiated intensity on EUV illumination. In order to achieve the local modulation in illumination intensity that is needed for lithography, the structured layer 108 is disposed on the etch stop layer 106. The structured layer 108 comprises, for example, tantalum boron nitride TaBN, tantalum nitride TaN, tantalum boron oxide TaBO and/or tantalum oxide TaO. To produce the structured layer 108, for example, a layer of TaBN is first applied over the full area, and is then selectively etched. In regions in which the TaBN layer remains, the incident working light is greatly attenuated. Because a reflected beam bundle passes twice through the TaBN layer, less than about 10% of the incident intensity is reflected in the regions of the TaBN layer.

During the production of the lithography mask 100, defects may occur (see, for example, FIG. 3). In the case of intensity-modulating lithography masks, a distinction is made in particular between clear and opaque defects. The result of a clear defect is that, on exposure at a position at which there is to be only low intensity or none, the intensity is too high. The result of an opaque defect is the opposite: in other words, at a respective position, the intensity is absent or is too low relative to the desired intensity.

In this example, possible sources of error are, in particular, errors in the construction of the multilayer mirror 104, including the etch stop layer 106, and also errors during the structuring of the structured layer 108. The latter can be repaired in a very targeted way, since these defects lie on the surface and are therefore directly accessible. One suitable technique for this purpose are particle beam-induced processes, since they enable targeted local working. Particles contemplated in this context include ions, electrons and photons (lasers or the like). Particularly advantageous are electron beams, since on the one hand they can be focused on a very small target point and on the other hand they cause only relatively very little damage, or none, such as a structural change to the surfaces subjected to the beam, for example. The reasons for this include, in particular, the fact that electrons have a comparatively low depth of penetration. In contrast, ions in particular penetrate the material more deeply, where they sometimes lead to doping and hence to a structural alteration of the material, with possible adverse consequences. Laser beams have the disadvantage relative to electron beams that they cannot be focused onto so small an area, and hence that the spatial selectivity and therefore the resolution of the working process is lower. The radiation in this example is an electron beam 110.

In this example there is an opaque defect 112, in the form of an unremoved part of the TaBN layer in the structured layer 108. The defect 112 is removed using a locally induced etching process. Required for this purpose are firstly the activating electron beam 110 (generally: particle beam 110) and secondly a first gaseous component GK1 which can be converted by activation into a reactive form.

The focused electron beam 110 is scanned over the target position ZP, in particular. The target position ZP has an extent, for example, in the range of 5 nm-2 μm. At the point of impingement, the focused particle beam 110 preferably has an approximately gaussian beam profile (based on the intensity) with a full width at half maximum in the range of 1-50 nm. The focusing can advantageously be adjusted. The electron beam 110 is deflected in such a way that for a mandated dwell time in each case it irradiates a point with the size of the point of impingement. It is also possible here to use the term “pixel”. The target position ZP is divided, for example, into pixels, which are irradiated in succession by the electron beam 110. The dwell time is situated, for example, in the range from several hundred picoseconds to microseconds. Depending on the size of the target position ZP and of a pixel, there is a defined cycle time for a complete pass. In the case of $10^6$ pixels and a dwell time of 1000 ps, the cycle time amounts, for example, to 1 ms. In an etching process, for example, several million cycles are applied to a target position ZP, meaning that the electron beam 110 scans over the target position ZP several million times.

The first gaseous component GK1, for example $XeF_2$, is preferably supplied in a targeted way to the target position ZP. In this case, individual $XeF_2$ molecules may be adsorbed on the surface of the lithography mask 100. In the adsorbed state, interaction between the adsorbed molecules and the surface atoms is comparatively strong. As a result of the activating electron beam 110 and/or as a result of secondary processes triggered by the electron beam 110 in the target point ZP, and especially by secondary electrons from near-surface atoms, the molecules of the first gaseous component GK1 are activated. In the example of $XeF_2$, this molecule is, for example, dissociated, with the resultant fluorine atoms or fluorine radicals reacting with surface atoms of the TaBN layer and forming volatile gaseous compounds which volatilize via the process atmosphere ATM. In this way there is a localized ablation of material.

Since $XeF_2$ is a comparatively reactive substance, there is to some extent, even without activation by a particle beam 110, a spontaneous reaction with surface atoms, which can lead to uncontrolled etching. This depends greatly on the combination utilized between first gaseous component GK1 (etching gas) and the chemistry of the free surface. To gain more effective control over the etching process it is possible to supply various additive gases, which fulfil a buffer function or a passivating function. Known in this context is the use of water in an etching process, which has a passivating effect. A problem with water, however, is that it may attack the etch stop layer 106, which consists, for example, of ruthenium or another noble metal. An alternative to water supplied in this example as second gaseous component GK2 is tetraethyl orthosilicate ($Si(OC_2H_5)_4$, also referred to as tetraethoxysilane, hereinafter TEOS for short). TEOS is a known deposition gas in particle beam-induced processes, and is used, for example, for the local generation of a layer of silicon oxide. Firstly, TEOS has a passivating effect, so that spontaneous etching processes do not occur substantially, or not at all, and secondly the etch stop layer 106 is not attacked. Under exposure to the electron beam 110, TEOS may lead to a deposit comprising silicon oxide, silicon nitride and silicon carbide, and also mixed phases of these compounds. This may contribute to the selectivity or control of the etching process. It may be noted, moreover, that silicon oxide, silicon nitride and silicon carbide carry out only relatively little attenuation of EUV radiation, and so a thin layer possibly formed in this case, with silicon oxide, silicon nitride and silicon carbide, is negligible.

In the etching process of the invention, the first and second gaseous components GK1, GK2 are preferably supplied to the target position ZP temporally before and/or during the beaming of the electron beam 110 onto the target position ZP. Accordingly, the composition of the process atmosphere ATM may be controlled while the electron beam 110 is being beamed onto the target position ZP, so that the advantageous effects described above and below are achieved through the use of the second gaseous component GK2 in the etching process.

Figure 2:
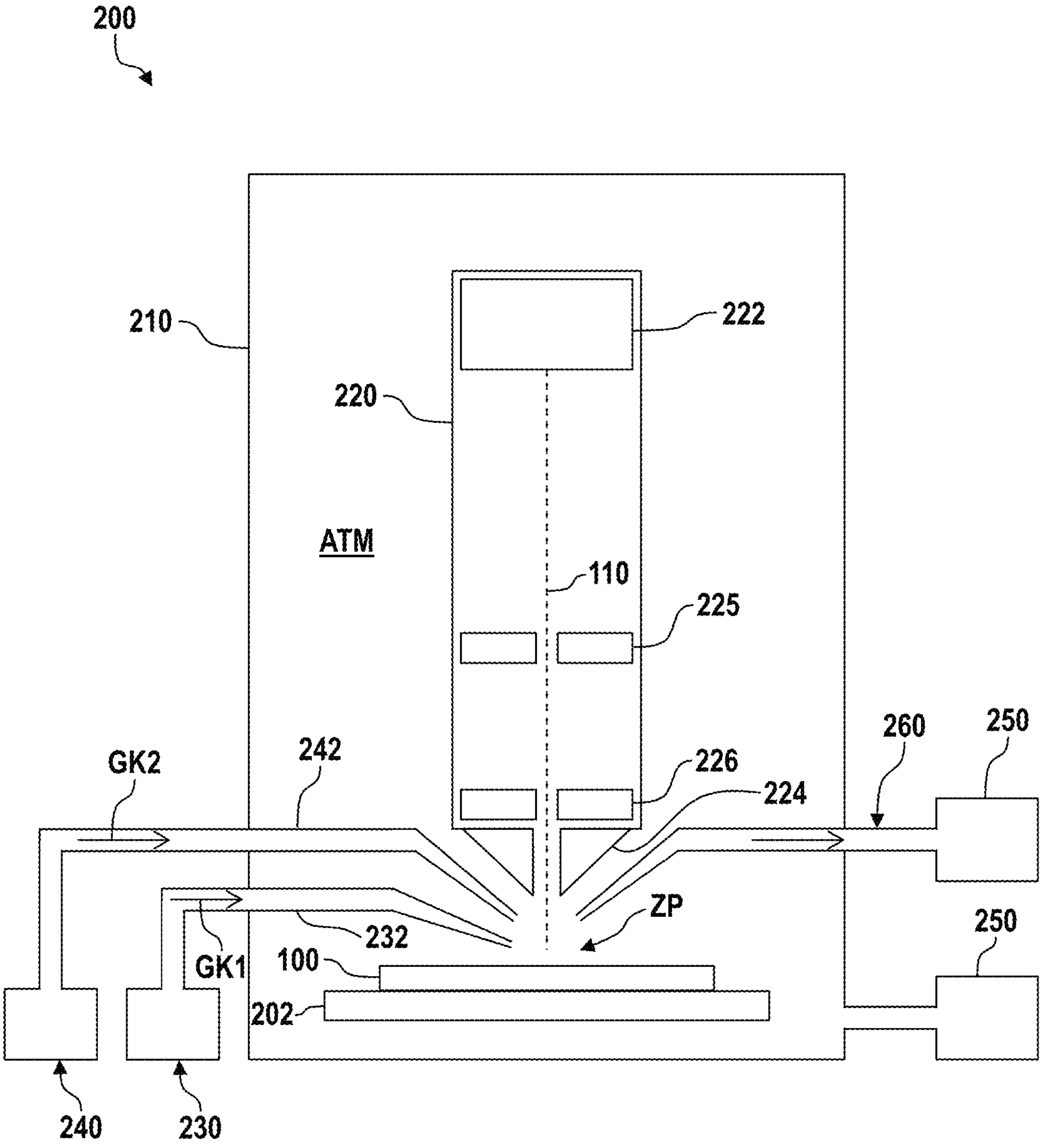
FIG. 2 shows a schematic block diagram of an apparatus for the particle beam-induced etching of a lithography mask.

FIG. 2 shows a schematic block diagram of an apparatus 200 for the particle beam-induced etching of a lithography mask 100, for example the EUV lithography mask 100 from FIG. 1. The apparatus 200 has a housing 210 which is evacuated by a vacuum pump 250 to a pressure in the range of $10^{-2}$-$10^{-8}$ mBar in order to create a process atmosphere ATM in the housing 210. The apparatus 200 has a means 220, disposed in the vacuum housing 210, for the provision of a focused particle beam 110. The means 220 has a beam preparation unit 222 and also one or more beam-guiding and/or beam-shaping means 224, 225, which direct the particle beam 110 in the desired way to the target point ZP. The device in question here is, for example, an electron column 220, which is configured for providing a focused electron beam 110. The beam-guiding and beam-shaping elements 224, 225 are embodied in this case, in particular, as multipoles. Further provided, advantageously, is a detector 226, which detects backscattered electrons and/or secondary electrons and is therefore configured for capturing an electron microscope image of the lithography mask 100. In this way it is possible to follow an operation of working on the lithography mask 100 in situ.

The apparatus 200 has a sample platform 202 for holding and positioning the lithography mask 100 to be worked on, and this platform can be actuated preferably in two, more preferably three, directions in space. Furthermore, the sample platform 202 may be mounted so as to be tiltable and rotatable, in order to align (not shown) the lithography mask 100 with the greatest possible precision in relation to the means 220, more particularly in relation to the particle beam 110. The sample platform 202 is advantageously mounted with vibration damping and is mechanically decoupled (not shown) from the rest of the construction.

Disposed outside the housing 210 are a means 230 for the provision of a first gaseous component GK1, and a means 240 for the provision of a second gaseous component GK2. The embodiment of the respective means 230, 240 is preferably such that they control a temperature of a solid or liquid phase of the respective component, in order to set a vapor pressure of the respective gaseous component GK1, GK2. In this way it is possible advantageously to achieve a gas flow of the respective gaseous component GK1, GK2 that is optimized for the respective process, without valves or the like. However, this is not to rule out the additional provision of valves or the like, since valves advantageously enable a very rapid changing of the gas flows. Each of the means 230, 240 has a supply line 232, 242 into the housing 210, which opens into a respective nozzle. The nozzle is directed advantageously at the target point ZP, so that the gas GK1, GK2 supplied comes into contact in a targeted way, at the target point ZP, with the surface of the lithography mask 100. This increases process control and also efficiency of the etching process. Further to the means 230, 240, there may be further means (not shown) provided, embodied in a similar way, for supplying further gaseous components, such as buffer gases, oxidizing or reducing gases, into the process atmosphere ATM.

Also shown is a suction withdrawal unit 260, which is configured to draw off excess gas and also, in particular, volatile reaction products under suction from the region of the target point ZP; this is done, for example, using a further vacuum pump 250. This allows the composition of the process atmosphere ATM to be controlled more effectively, and in particular it prevents reaction products from settling elsewhere on the lithography mask 100 or other, unforeseen processes taking place with excess gas.

Figure 3A:
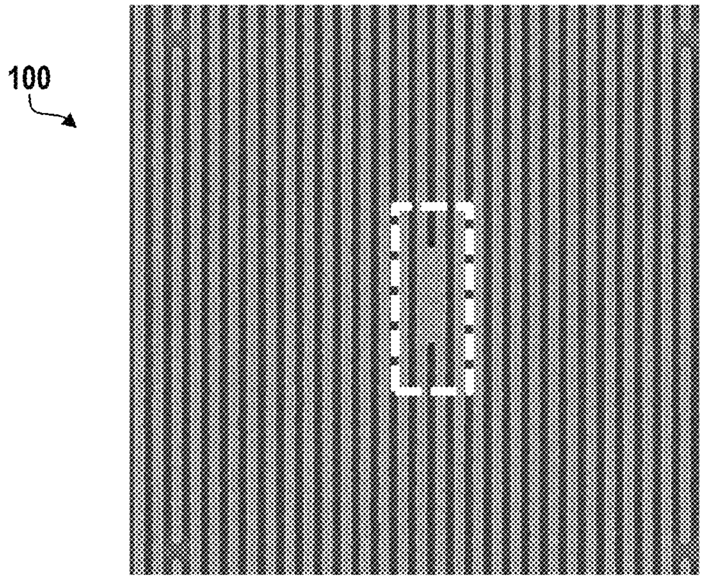
FIGS. 3A and 3B show an electron microscope image of a lithography mask before and after a particle beam-induced etching process.
Figure 3B:
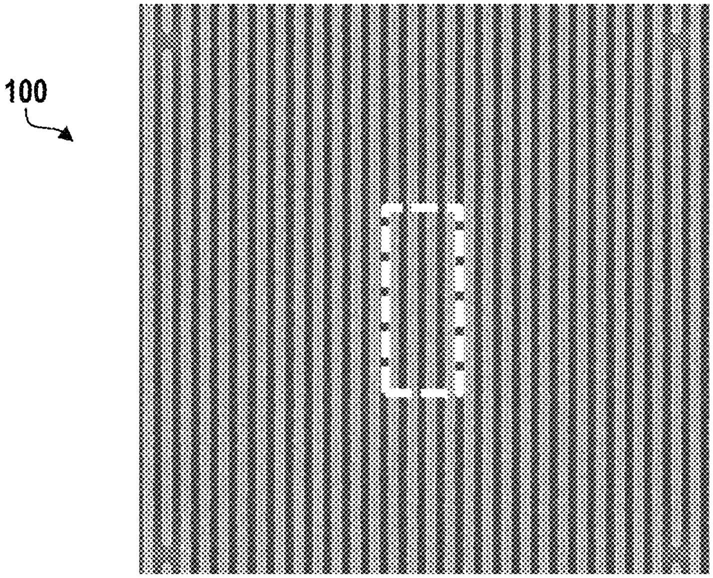

FIGS. 3A and 3B show an electron microscope image of a lithography mask 100 before and after a particle beam-induced etching process. The example depicted here has parallel structures; this, however, is merely illustrative and should not be interpreted as imposing any limitation. Other lithography masks may have various other geometric forms. The lithography mask 100 depicted is, in particular, an EUV lithography mask, having the layer structure shown in FIG. 1, for example.

FIG. 3A shows the lithography mask 100 with a defect in the form of an absorbing region, which is not intended at this point. The box with white dashes serves to emphasize the defective region. The EUV lithography mask 100 is subjected with the apparatus 200 of FIG. 2, for example, to the proposed particle beam-induced etching process, with the target position ZP (see FIG. 1) specified being the region of the lithography mask 100 whose material is to be removed.

FIG. 3B shows the EUV lithography mask 100 after the etching process has been carried out. It is apparent that the defect has been successfully removed and the lines on the lithography mask 100 are now all separate from one another. The white box serves to emphasize the repair site. The lithography mask 100 now has the intended structure and can be used, for example, in an EUV lithography process.

Figure 4A:
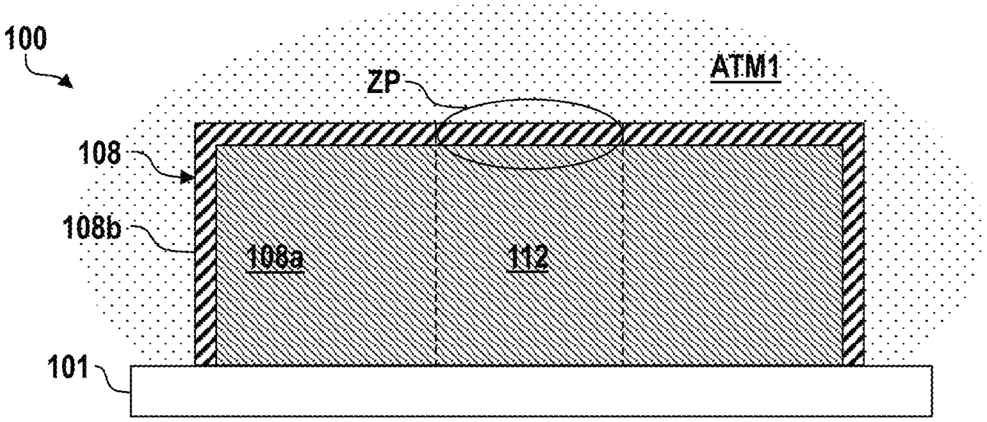
FIGS. 4A-C show a known particle beam-induced etching process on a lithography mask.
Figure 4B:
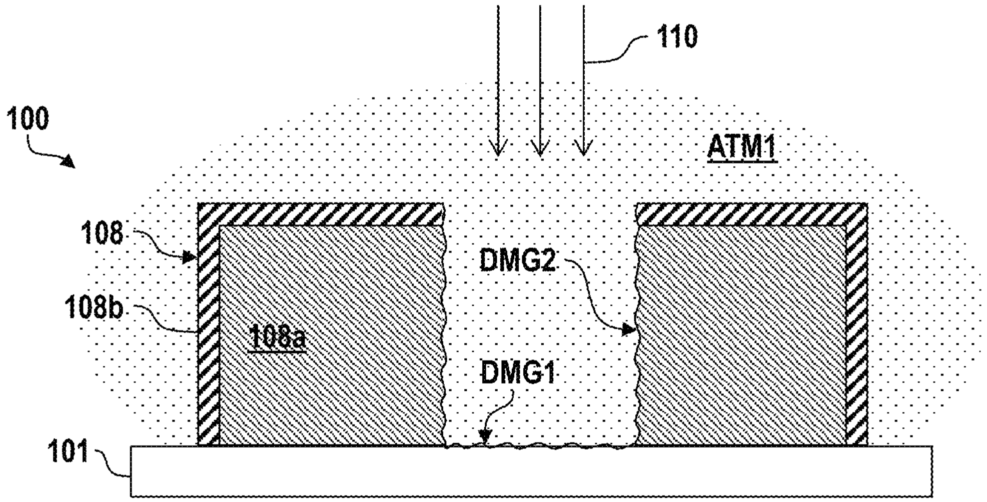
Figure 4C:
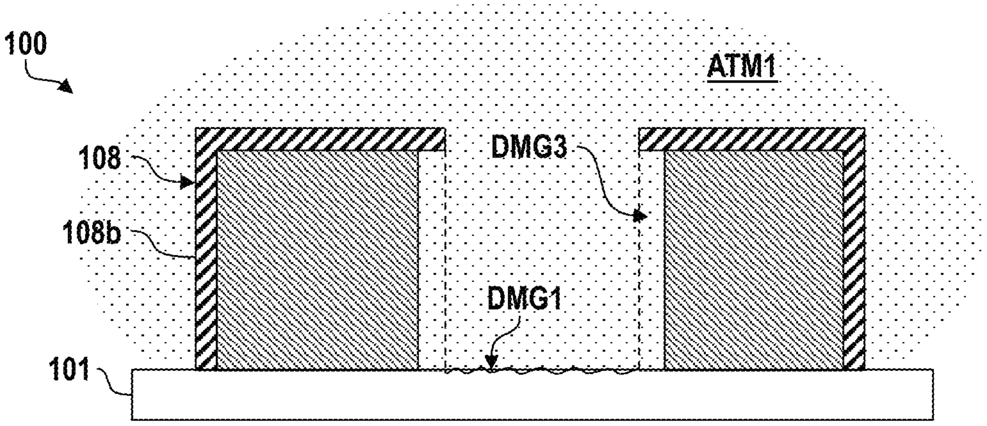

FIGS. 4A-4C show schematically a known particle beam-induced etching process on a lithography mask 100. With the known process there are unwanted side effects, as elucidated below. FIG. 4A shows the initial situation, with the lithography mask 100 disposed in the process atmosphere ATM1. A structured layer 108 consisting substantially of a first material 108*a*, such as of tantalum nitride TaN, for example, is being etched. The surface of the layer 108 consists of a different material 108*b*, comprising tantalum oxide TaO and/or tantalum oxynitride TaON, for example. A near-surface layer 108*b* of this kind may be formed spontaneously by itself, with the layer 108*b* in that case having a thickness of a few nanometers, or may be deposited in a targeted way, in which case the layer thickness can be set arbitrarily, for example. The lithography mask 100 may have further layers, as shown in FIG. 1, which have not been shown here, for reasons of clarity. The etching process is carried out, for example, by use of the apparatus 200 of FIG. 2.

The process in FIGS. 4A-4C is carried out with a process atmosphere ATM1 which comprises, for example, $XeF_2$ as etching gas and Hao as passivating gas. The intention, for example, is to remove a defect 112, as shown in FIG. 3A. The defect 112 is bounded here by the dashed lines. The target position ZP is placed correspondingly in the region of the defect 112.

As shown in FIG. 4B, the etching process is carried out in a targeted way by the particle beam 110, with the layer 108 in the target position ZP being removed down to the substrate 101. The target position ZP is divided, for example, into pixels, with one pixel corresponding to the area of impingement of the focused particle beam 110 on the layer 108, and the particle beam 110 scans over the target position pixel by pixel. In each cycle, a number of layers of atoms of the layer 108 are ablated. In this case, the outer layer 108*b* first of all and then the inner layer 108*a* are exposed in sections.

During the etching process there may be unwanted instances of damage DMG1, DMG2. Thus, for example, the substrate 101 of the lithography mask 100 may be damaged, as represented by the rough surface DMG1. Because the etching procedure does not always take place with exactly the same rapidity at every pixel of the target position ZP, a situation occurs in which the substrate 101 has already been exposed at certain pixels, while at others there remains material to be ablated. The etching process is therefore continued, and this, in the regions in which the substrate 101 is already lying open, may result in instances of damage DMG1 by the particle beam 110 and also by the aggressive etching gas, especially in activated form, and/or by the water which is present as passivating gas in the process atmosphere ATM1.

Moreover, at an edge of the target position ZP, where a side wall of the layer 108 is exposed as the etching procedure progresses, there may be further instances of damage DMG2. Examples of this are etching processes which attack the exposed side wall of the layer 108, possibly leading to degradation of the side wall.

After the end of this etching process at the target position ZP shown, an etching process is carried out (not shown), for example, at another position of the lithography mask 100. During this procedure the gases in the process atmosphere ATM1 continue to be in direct contact with the exposed layer 108*a*. In this scenario there may be spontaneous reactions in which the exposed material 108*a* is attacked. As a result, an unwanted etching process may occur, and may lead to further damage DMG3 in the form of an under-etching of the surface layer 108*b*, as shown in FIG. 4C. This process, proceeding without control, may therefore stand in the way of a targeted etching process. The damage DMG3 occurs, for example, when the near-surface layer 108*b* is not attacked, or is only insubstantially attacked, by the first gaseous component GK1, whereas the material 108*a* is attacked significantly.

Figure 5A:
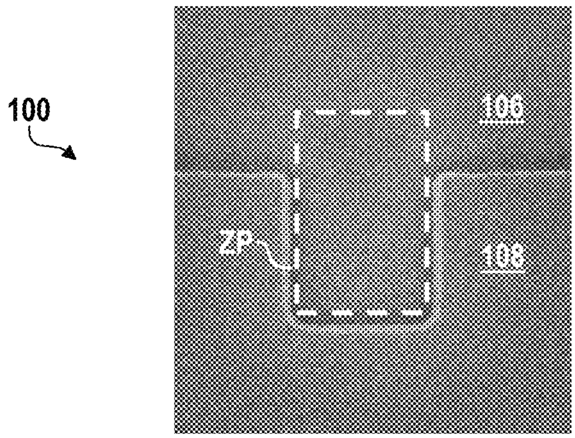
FIGS. 5A-5C show a sequence of electron microscope images of a lithography mask before and after etching by a known etching process.
Figure 5B:
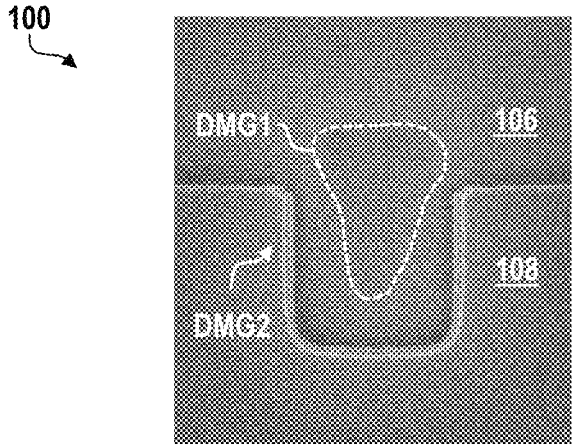
Figure 5C:
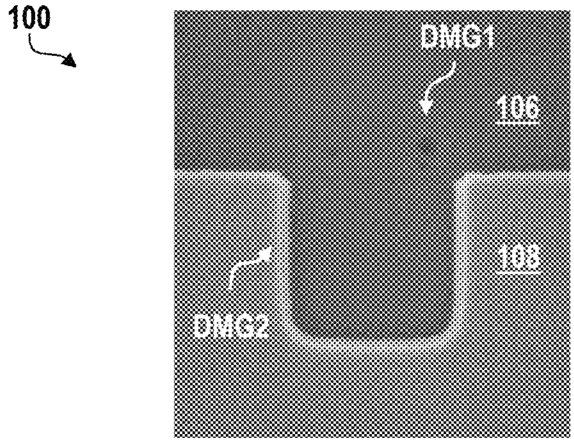

FIGS. 5A-5C show a sequence of electron microscope images of a lithography mask 100 before (FIG. 5A) and after (FIGS. 5B and 5C) a particle beam-induced etching with the etching process described with reference to FIGS. 4A-4C. The lithography mask 100 has, for example, a structure as shown in FIG. 1.

The substrate 106 and the structured layer 108 are clearly visible in the electron microscope images. FIG. 5A shows the target position ZP in the form of a dashed box. In this case the target position ZP is located on the substrate 106. The focused particle beam 110 scans over the target position ZP (see FIG. 1 or 2) as described with reference to FIG. 1.

FIG. 5B shows the worked-on region after the etching process, the image having been captured with an electron beam energy of 600 V. With this energy it is possible to capture topological structures in particular. In the region subjected to the particle beam 110, a slight discoloration is perceptible, which indicates that in this region the substrate surface is damaged. The damaged region is emphasized by the dashed line DMG1. Furthermore, a comparison of the edges of the layer 108 with FIG. 5A shows that these edges likewise exhibit damage DMG2 and are no longer so sharply defined.

FIG. 5C shows a further image of the worked-on region, the image having been captured with a higher electron beam energy, causing contrasts of material, in particular, to become visible. The dark points DMG1 indicate that at these sites the etch stop layer 106 has been etched away entirely. At these sites it is also not possible to rule out even deeper damage, to the multilayer mirror 104, for example (see FIG. 1).

The instances of damage DMG1, DMG2 shown lead, for example, to reduced reflection of EUV radiation in a lithography process, with the possible consequence of errors in the production of microstructured components. At the frayed edges, more radiation is scattered, and this may likewise impair an exposure process.

Figure 6A:
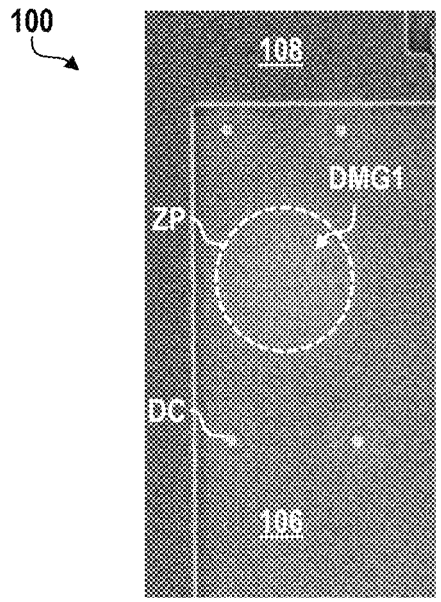
FIGS. 6A-6C show damage to a substrate, caused by a known etching process.
Figure 6B:
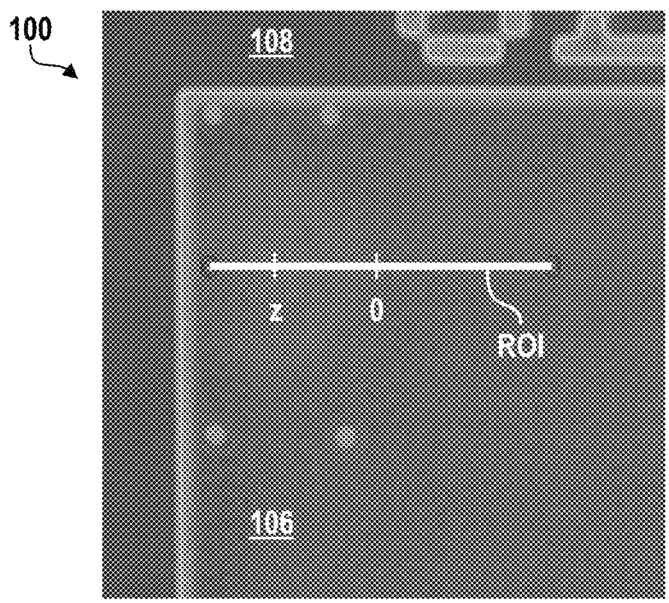
Figure 6C:
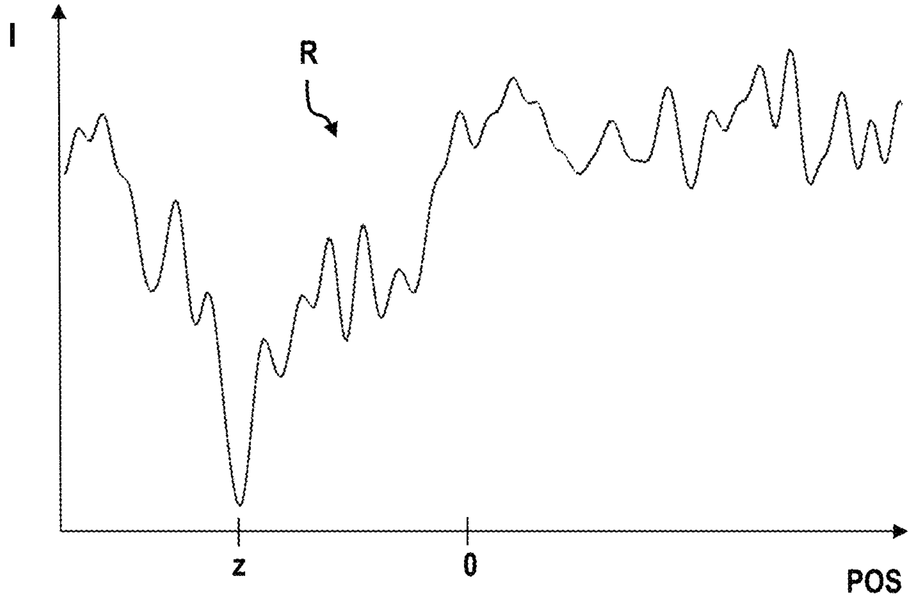

FIGS. 6A-6C show further damage, caused by a known etching process, to an etch stop layer 106 on an EUV lithography mask 100, having the same construction, for example, as the lithography mask shown in FIG. 1. In this case, for example, the etching process used involved the supplying of $XeF_2$ as etching gas, $H_2O$ as passivating gas, and $NO_2$ as buffer gas. The etching process was used to remove a column of tantalum boron nitride TaBN material located in the region of the target position ZP.

FIG. 6A shows an electron microscope image of the worked-on region of the lithography mask 100. A distinct lightening is visible in the region of the target position ZP, and suggests damage DMG1. Also in evidence are four positional markers DC. For reasons of clarity, only one has been labelled with a reference sign. The purpose of the positional markers DC is to visualize and compensate a relative shift between the lithography mask 100 and the means 220 (see FIG. 2) for providing the focused particle beam 110 (see FIG. 1 or 2) during the beaming process. In this case the positional markers DC are regularly scanned during the etching process, and for this reason a lightened, damaged region is visible around them as well.

FIG. 6B shows an image of the lithography mask 100, captured with actinic radiation. FIG. 6B shows, for example, a two-dimensional intensity distribution of the reflected radiation, such as would occur on the sample in a lithography process with the lithography mask 100. Differences in lightness correspond to differences in intensity. The reflected intensity is about 70% in the region of the etch stop layer 106 and less than 10% in the region of the structured layer 108. The damaged region DMG1 can likewise be recognized as lightening. A region of interest ROI is shown, which passes through the damaged region DMG1. The intensity values of the region of interest ROI are plotted in FIG. 6C as a function of position, with the markers ("z" and "0") coinciding with FIG. 6B.

The diagram of FIG. 6C shows the reflected intensity R of the EUV radiation in the region of interest ROI as a function of the position. The positions "z" and "0" coincide with FIG. 6B. The vertical axis shows the intensity I, which is normalized, for example, to the highest value. The measurement shows that there is a minimum in the reflected intensity at the position "z". This shows that the damage to the etch stop layer 106 leads to poorer reflectivity of EUV radiation, and hence to a poorer lithography process.

Figure 7A:
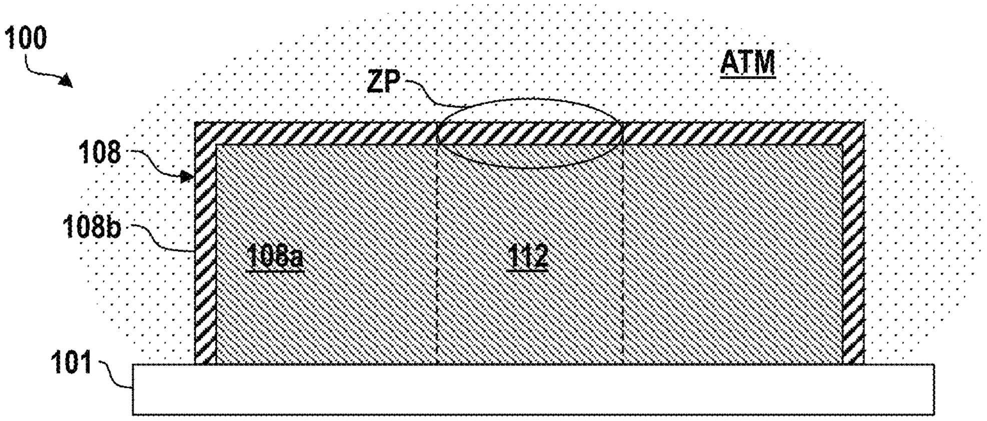
FIGS. 7A-7C show a particle beam-induced etching process of the invention on a lithography mask.
Figure 7B:
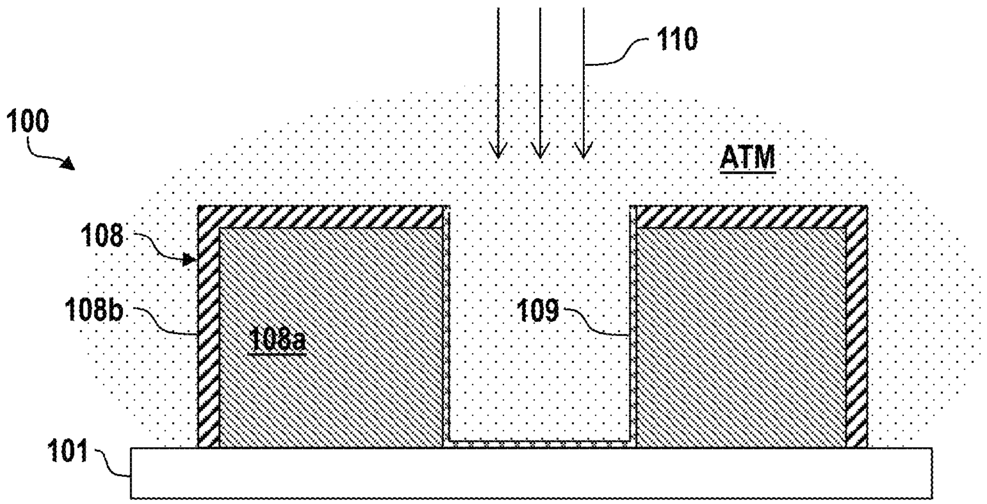
Figure 7C:
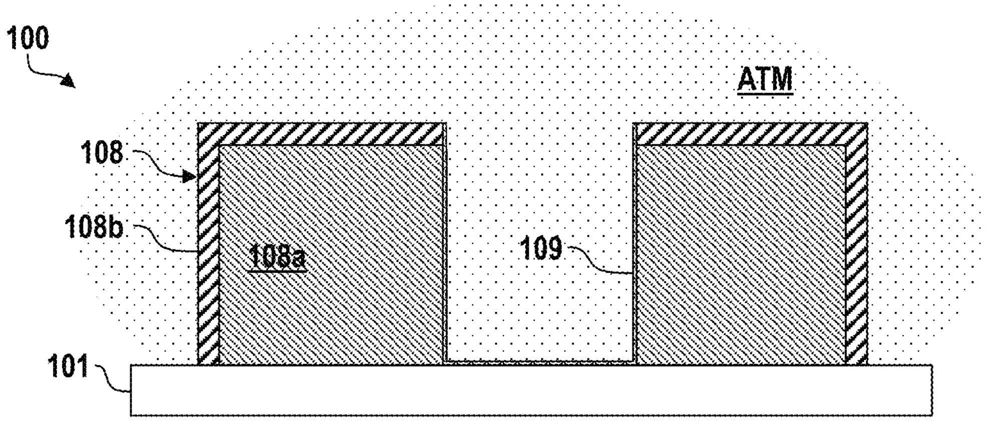

FIGS. 7A-7C show, in analogy to FIGS. 4A-4C, an etching process, which here, however, is carried out in accordance with the invention. Consequently the unwanted or uncontrolled side effects elucidated with reference to FIGS. 4A-4C are substantially suppressed.

In the example of FIGS. 7A-7C, the process atmosphere ATM comprises, for example, $XeF_2$ as etching gas and TEOS as additive gas. The etching process proceeds in a targeted way, as in the case of the example of FIG. 4B as well, as shown in FIG. 7B. In contrast to FIG. 4B, however, the presence of TEOS in the process atmosphere ATM leads to the formation of a passivating layer 109, consisting substantially of silicon oxide or silicon dioxide, for example. This passivating layer 109 may be generated, for example, by the deposition of the second gaseous component GK2 from the process atmosphere ATM, and/or by chemical reactions of molecules of the second gaseous component GK2 with the exposed material 108*a*. The passivating layer 109 has the advantageous effect that the exposed surface of the substrate 101 and also of the layer 108*a* is sealed or passivated, and so damage of the kind explained with reference to FIG. 3B does not occur, or occurs only insubstantially. It may be noted that the layer 109 as well can be ablated by the activated etching process. Advantageously, therefore, a high layer thickness of the layer 109 is not formed. The process is controlled in particular by the control of the gas supply, which determines the composition of the process atmosphere ATM in the region of the target position ZP.

The passivating layer 109 therefore has the advantage that damage to the substrate 101 is reduced or entirely suppressed. Furthermore, spontaneous etching reactions which may likewise limit the quality of the lithography mask 100 are prevented. A very targeted and clean etching process is therefore possible.

In particular it may be the case that a unified layer 109 is not formed, and that instead only a number of atoms of the second gaseous component GK2 are deposited from the process atmosphere ATM on the surface ablated by the etching process, and/or react with atoms from the surface layer. Layer formation is therefore avoided.

Figure 8A:
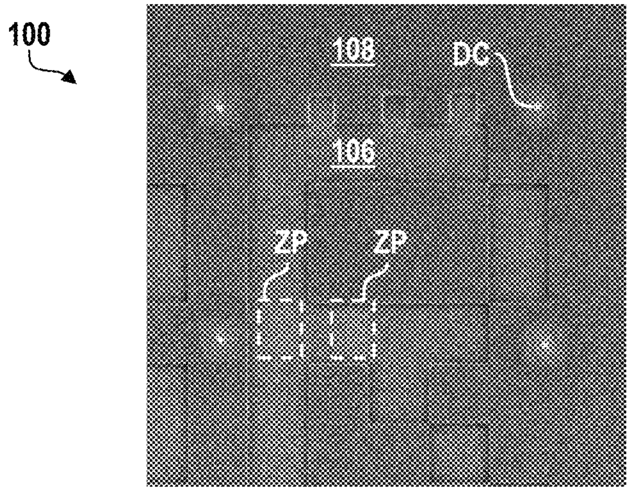
FIGS. 8A-8C show a lithography mask worked on with an etching process of the invention.
Figure 8B:
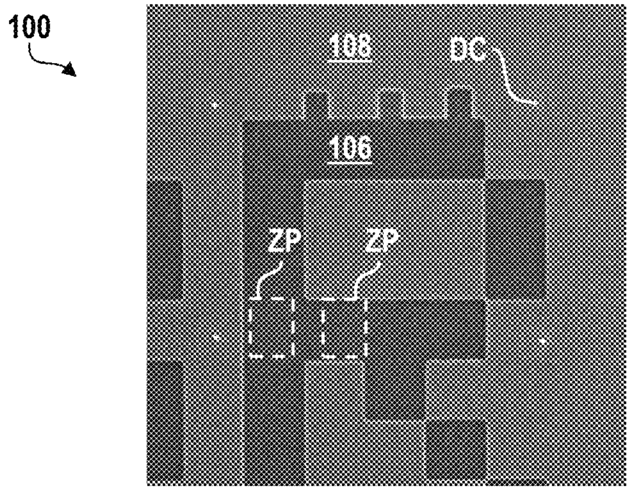
Figure 8C:
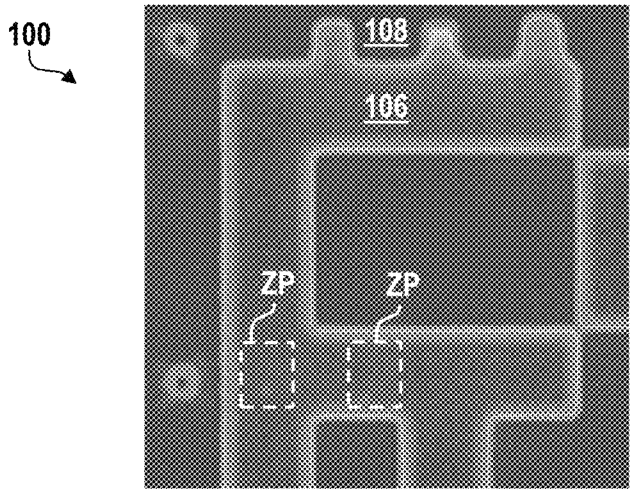

FIGS. 8A-8C show a lithography mask 100 worked on with an etching process of the invention. The lithography mask 100 has, for example, the layer construction elucidated with reference to FIG. 1. Visible on the top side is, partially, the structured layer 108 and, partially, the etch stop layer 106. The lithography mask 100 was subjected to an etching process in which the first gaseous component GK1 supplied (see FIG. 1 or 2) was $XeF_2$ and the second gaseous component supplied (see FIG. 1 or 2) was TEOS. No further additive gases were used. The gas flow was controlled via the temperature of the respective liquid or solid phase of the component, with $XeF_2$ being held in this example at a temperature of −20° C., and TEOS at a temperature of −33° C. To activate the first gaseous component GK1, a focused electron beam 110 (see FIG. 1 or 2) was used. The etching process was carried out on two adjacent, rectangular target positions ZP on the exposed etch stop layer 106.

FIG. 8A here shows an electron microscope image of the worked-on region of the lithography mask 100, which was captured with an electron energy of 600 V, meaning that surface structures are readily apparent. In the region of the two target positions ZP, a very slight lightening is perceptible, suggesting a slight alteration to the surface structure, for example the surface roughness.

FIG. 8B shows an electron microscope image of the worked-on region of the lithography mask 100, captured with a higher electron energy, producing sharp contrasts of material. In this image it would be apparent if a deposit has formed on the etch stop layer 106 or if the etch stop layer 106 has been etched away, as can be seen in FIG. 5C. FIG. 8B shows that essentially no deposit has formed and also that the etch stop layer 106 has not been substantially attacked during the etching process.

FIG. 8C shows an image of the lithography mask 100 taken with actinic radiation, showing the reflected intensities. The reflected intensity is about 70% in the region of the etch stop layer 106 and less than 10% in the region of the structured layer 108. In the region of the target positions ZP, only very insubstantial deviations can be seen in comparison to the remaining, unirradiated surface of the etch stop layer 106.

In this case, in comparison to the conventional process, which leads to damage (see FIGS. 5A-5C and also 6A-6C), the etch stop layer 106 is not damaged.

Figure 9:
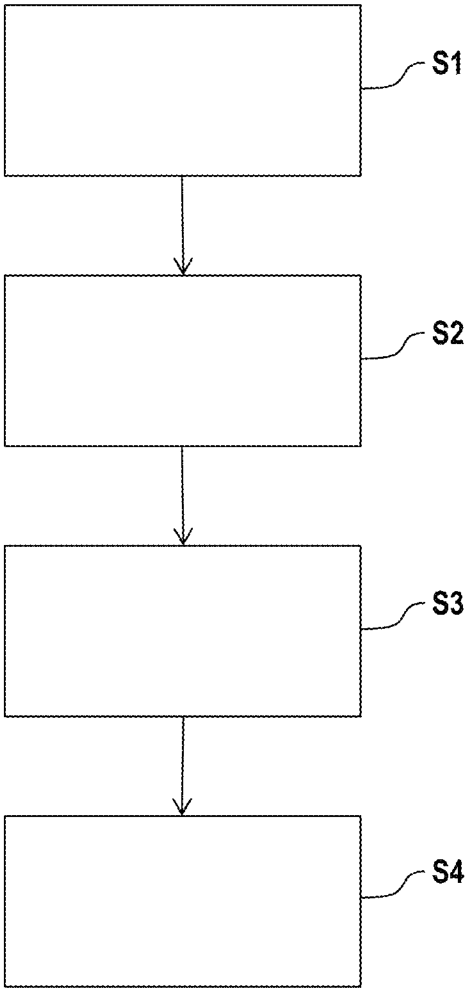
FIG. 9 shows a schematic block diagram of a method for working on a lithography mask with a particle beam-induced etching process.

FIG. 9 shows a schematic block diagram of a method for working on a lithography mask 100 (see FIGS. 1-8) with a particle beam-induced etching process. In a first step S1, the lithography mask 100 is provided in a process atmosphere ATM (see FIGS. 1, 2 and 7). For example, the lithography mask 100 is arranged on the sample platform 202 of the apparatus 200 and the housing 210 is evacuated to a pressure of about $10^{-6}$-$10^{-8}$ mBar. In a second step S2, a focused particle beam 110 (see FIG. 1 or 2) is beamed onto a target position ZP (see FIGS. 1-8) on the lithography mask 100. In a third step S3, a first gaseous component GK1 (see FIG. 1 or 2) is supplied to the target position ZP in the process atmosphere ATM. The first gaseous component GK1 can be converted by activation into a reactive form, with the reactive form reacting with a material of the lithography mask 100 to form a volatile compound. The first gaseous component GK1 is activated in particular by the particle beam 110 and/or by secondary effects triggered by the particle beam 110. In a fourth step S4, at least one second gaseous component GK2 (see FIGS. 1 and 2) is supplied to the target position ZP in the process atmosphere ATM. Under predetermined process conditions, on exposure to the particle beam 110, the second gaseous component GK2 forms a deposit comprising a compound of silicon with oxygen, nitrogen and/or carbon. The process conditions in the etching process are preferably selected such that no deposit or only a very slight deposit is formed.

In the method, the third step S3 and the fourth step S4 are carried out, in particular, temporally before and/or synchronously to the second step S2.

Figure 10:
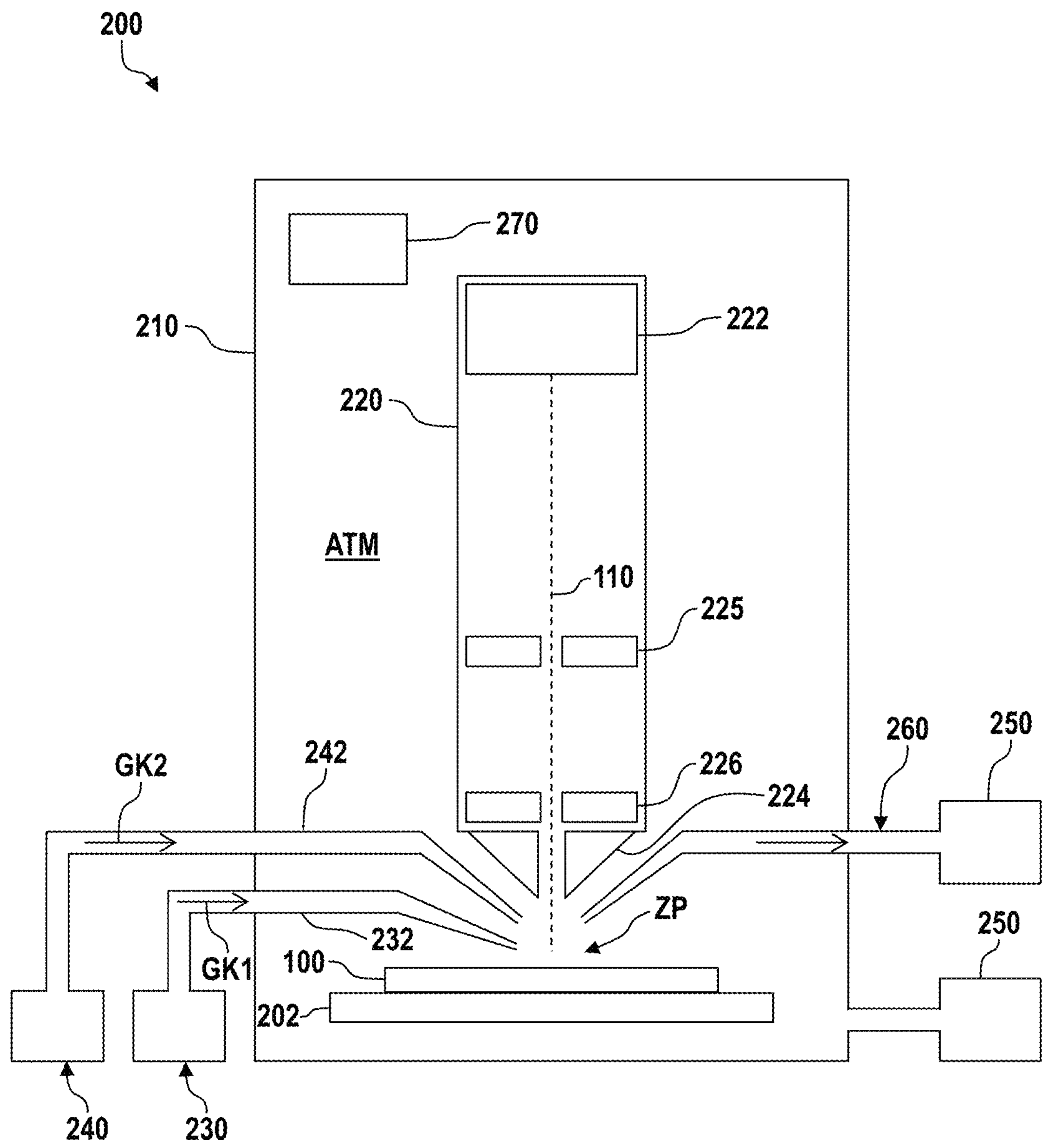
FIG. 10 shows a schematic block diagram of another apparatus for the particle beam-induced etching of a lithography mask.

FIG. 10 shows a schematic block diagram of another embodiment of an apparatus 200 for the particle beam-induced etching of a lithography mask 100. The apparatus 200 of FIG. 10 has all of the features of the apparatus 200 elucidated with reference to FIG. 2, and for that reason these features are not elucidated again here. The apparatus 200 is operated, in particular, by use of the method elucidated with reference to FIG. 9.

In addition, the apparatus 200 in FIG. 10 has a control device 270. The control device 270 is embodied, for example, as a part of a control computer for controlling the apparatus 200. The control device 270 is configured for actuating the means 220 for the focused beaming of the particle beam 110 at the target position ZP, for actuating the means 230 for the provision of the first gaseous component GK1 at the target position ZP, and for actuating the means 240 for the provision of the second gaseous component GK2 at the target position ZP. In this arrangement, the control device 270 actuates the means 230 and the means 240 in such a way that the first gaseous component GK1 and the second gaseous component GK2 are provided temporally before and/or synchronously to the focused beaming of the particle beam 110 at the target position ZP.

The concept of the control device 270 actuating the respective means is understood, for example, to mean that the control device 270 sends a control command to the respective means, more particularly to a controller of the respective means, this control command comprising the settings for the respective means that are intended at a respective point in time in the method. The control command may be transmitted by wire or else wirelessly, via an optical transmission section, for example.

Although the present invention has been described on the basis of exemplary embodiments, it is modifiable in diverse ways.

LIST OF REFERENCE SIGNS

100 Lithography mask
101 Substrate
102 Substrate
104 Multilayer mirror
106 Etch stop layer
108 Structured layer
108*a* Layer
108*b* Layer
109 Layer
110 Particle beam
112 Defect
200 Apparatus
202 Sample platform
210 Housing
220 Means
222 Beam preparation unit
224 Beam-guiding means
225 Beam-shaping means
226 Detector
230 Means
240 Means
250 Vacuum pump
260 Suction withdrawal unit
270 Control device
ATM Process atmosphere
ATM1 Process atmosphere
DC Positional marker
DMG1 Damage
DMG2 Damage
DMG3 Damage
GK1 Gaseous component
GK2 Gaseous component
I Intensity
POS Position
R Reflected intensity
ROI Region of interest
S1 Method step
S2 Method step
S3 Method step
S4 Method step
z Position
ZP Target point

What is claimed is:

1. A method for the particle beam-induced etching of a lithography mask, having the steps of:

a) providing the lithography mask in a process atmosphere, b) beaming a focused particle beam onto a target position on the lithography mask, c) supplying at least one first gaseous component to the target position in the process atmosphere, where the first gaseous component can be converted by activation into a reactive form, where the reactive form reacts with a material of the lithography mask to form a volatile compound, and d) supplying at least one second gaseous component to the target position in the process atmosphere, where the second gaseous component comprises a compound of silicon with oxygen, nitrogen and/or carbon, wherein steps c) and d) are carried out temporally before and/or synchronously to step b).

2. The method of claim 1, wherein the second gaseous component comprises a silicate, a silane, a siloxane, a silazane and/or a silicon isocyanate.

3. The method of claim 1, wherein the second gaseous component under predetermined process conditions with exposure to the particle beam forms a deposit comprising a compound of silicon with oxygen, nitrogen and/or carbon.

4. The method of claim 3, wherein a deposit formed by the second gaseous component during the etching process is removed in a step of wet-chemical cleaning of the lithography mask.

5. The method of claim 1, wherein the first gaseous component comprises one of xenon difluoride $XeF_2$, sulfur hexafluoride $SF_6$, sulfur tetrafluoride $SF_4$, nitrogen trifluoride $NF_3$, phosphorus trifluoride $PF_3$, tungsten hexafluoride $WF_6$, tungsten hexachloride $WCl_6$, molybdenum hexafluoride $MoF_6$, hydrogen fluoride HF, nitrogen oxygen fluoride NOF, triphosphorus trinitrogen hexafluoride $P_3N_3F_6$.

6. The method of claim 1, wherein the supplying of the second gaseous component takes place temporally before and/or after the beaming of the particle beam onto the target position.

7. The method of claim 1, wherein the supplying of the second gaseous component takes place during the beaming of the particle beam onto the target position.

8. The method of claim 1, including:

supplying a third gaseous component, which comprises an oxidizing agent and/or a reducing agent.

9. The method of claim 8, wherein the supplying of the third gaseous component comprises:

providing a solid or liquid phase of the respective component, setting a temperature of the solid or liquid phase of the respective component such as to attain a mandated vapor pressure of the respective component over the solid or liquid phase, and supplying the respective gaseous component into the process atmosphere via a respective supply line.

10. The method of claim 9, wherein a mass flow rate and/or volume flow rate of the respective component is controlled by setting a line cross section of the respective supply line and/or by controlling a duty cycle of a closing valve.

11. The method of claim 1, wherein the particle beam consists of charged particles.

12. The method of claim 1, wherein the lithography mask is embodied for use in EUV lithography.

13. The method of claim 1, wherein the lithography mask has an etch stop layer whose facing side carries a structured lamina composed of a material which is absorbent for the radiation used in a lithography process, where an etching rate of the activated first gaseous component in relation to the etch stop layer is lower at least by a factor of 2 than the etching rate in relation to the structured lamina.

14. The method of claim 12, wherein the lithography mask has a mirror layer embodied as a multilayer mirror composed of a plurality of double layers, where a respective double layer comprises a first layer composed of a first chemical composition and a second layer composed of a second chemical composition, where a respective layer thickness of the first and second layers is in a range of 3-50 nm.

15. The method of claim 1, wherein the particle beam has an energy of 1 eV-100 keV.

16. A lithography mask produced by a method of claim 1.

17. The method of claim 1, wherein the supplying of the first gaseous component and/or the second gaseous component comprises:

providing a solid or liquid phase of the respective component, setting a temperature of the solid or liquid phase of the respective component such as to attain a mandated vapor pressure of the respective component over the solid or liquid phase, and supplying the respective gaseous component into the process atmosphere via a respective supply line.

18. An apparatus configured to perform particle beam-induced etching of a lithography mask, comprising means for:

a) providing the lithography mask in a process atmosphere, b) beaming a focused particle beam onto a target position on the lithography mask, c) supplying at least one first gaseous component to the target position in the process atmosphere, where the first gaseous component can be converted by activation into a reactive form, where the reactive form reacts with a material of the lithography mask to form a volatile compound, and d) supplying at least one second gaseous component to the target position in the process atmosphere, where the second gaseous component comprises a compound of silicon with oxygen, nitrogen and/or carbon, wherein steps c) and d) are carried out temporally before and/or synchronously to step b).

19. The apparatus of claim 18, wherein the second gaseous component comprises a silicate, a silane, a siloxane, a silazane and/or a silicon isocyanate.

20. The apparatus of claim 18, wherein the second gaseous component under predetermined process conditions with exposure to the particle beam forms a deposit comprising a compound of silicon with oxygen, nitrogen and/or carbon.

21. The apparatus of claim 18, wherein the first gaseous component comprises at least one of xenon difluoride $XeF_2$, sulfur hexafluoride $SF_6$, sulfur tetrafluoride $SF_4$, nitrogen trifluoride $NF_3$, phosphorus trifluoride $PF_3$, tungsten hexafluoride $WF_6$, tungsten hexachloride $WCl_6$, molybdenum hexafluoride $MoF_6$, hydrogen fluoride HF, nitrogen oxygen fluoride NOF, or triphosphorus trinitrogen hexafluoride $P_3N_3F_6$.

* * * * *